United States Patent
Jang et al.

(10) Patent No.: US 11,251,371 B2
(45) Date of Patent: Feb. 15, 2022

(54) NONVOLATILE MEMORY DEVICE HAVING MULTI-LEVEL RESISTANCE AND CAPACITANCE CHARACTERISTICS, AND MANUFACTURING METHOD THEREOF

(71) Applicant: GWANGJU INSTITUTE OF SCIENCE AND TECHNOLOGY, Gwangju (KR)

(72) Inventors: Jae Hyung Jang, Gwangju (KR); Rani Anoop, Gwangju (KR); Se I Oh, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 51 days.

(21) Appl. No.: 16/497,279

(22) PCT Filed: Mar. 20, 2018

(86) PCT No.: PCT/KR2018/003212
§ 371 (c)(1),
(2) Date: Sep. 24, 2019

(87) PCT Pub. No.: WO2018/174514
PCT Pub. Date: Sep. 27, 2018

(65) Prior Publication Data
US 2020/0313085 A1    Oct. 1, 2020

(30) Foreign Application Priority Data
Mar. 24, 2017 (KR) .......................... 10-2017-0037924

(51) Int. Cl.
*H01L 27/24* (2006.01)
*H01L 45/00* (2006.01)

(52) U.S. Cl.
CPC ........ *H01L 45/1253* (2013.01); *H01L 45/146* (2013.01); *H01L 45/1608* (2013.01)

(58) Field of Classification Search
CPC ... H01L 45/12; H01L 45/125; H01L 45/1253; H01L 45/14; H01L 45/146; H01L 45/16; H01L 45/1608; H01L 27/24
(Continued)

(56) References Cited

U.S. PATENT DOCUMENTS

2006/0152963 A1  7/2006  Bhattacharyya et al.
2009/0003082 A1  1/2009  Meeks et al.
(Continued)

FOREIGN PATENT DOCUMENTS

KR  10-2010-0087347 A  8/2010

*Primary Examiner* — Fazli Erdem
(74) *Attorney, Agent, or Firm* — Novick, Kim & Lee, PLLC; Jae You Kim; Jihun Kim

(57) ABSTRACT

A nonvolatile memory device having multi-level resistance and capacitance values is provided. Such a nonvolatile memory device includes: a substrate; a first electrode that is provided on the substrate; a dielectric layer that is provided on the first electrode, has resistance and capacitance changed by a tunneling conduction phenomenon of charges according to an applied voltage, has rectifying characteristics, and includes a dielectric material; an active layer that is provided on the dielectric layer, has resistance and capacitance changed according to an applied voltage, and includes a graphene oxide complex; and a second electrode that is provided on the active layer. In addition, the nonvolatile memory device has multi-level resistance and capacitance values according to an applied voltage.

5 Claims, 17 Drawing Sheets

(58) Field of Classification Search
USPC .............................................................. 257/4
See application file for complete search history.

(56) References Cited

U.S. PATENT DOCUMENTS

| | | |
|---|---|---|
| 2011/0267897 A1 | 11/2011 | Wang |
| 2012/0205606 A1 | 8/2012 | Lee et al. |
| 2015/0036413 A1 | 2/2015 | Dellmann et al. |
| 2016/0020280 A1* | 1/2016 | Heo ..................... H01L 29/267 257/27 |
| 2016/0020420 A1* | 1/2016 | Lee ....................... H01L 51/442 136/256 |
| 2016/0240692 A1* | 8/2016 | Shepard ............ H01L 29/66015 |
| 2017/0170011 A1* | 6/2017 | Zheng ............... H01L 21/02356 |
| 2017/0323929 A1* | 11/2017 | Bessonov ........... H01L 27/2436 |
| 2017/0365781 A1* | 12/2017 | Jang ................... G11C 13/0007 |

* cited by examiner

NONVOLATILE MEMORY DEVICE HAVING MULTI-LEVEL RESISTANCE AND CAPACITANCE CHARACTERISTICS, AND MANUFACTURING METHOD THEREOF

TECHNICAL FIELD

The present invention relates to a nonvolatile memory device having multi-level resistance and capacitance characteristics and a manufacturing method thereof, and more specifically, to a nonvolatile memory device for implementing multi-level cell operation by changing resistance and capacitance of an active layer according to an applied voltage and a manufacturing method thereof.

BACKGROUND ART

Generally, since a memory semiconductor has more storage capacity as the memory semiconductor gets smaller, development of miniaturization technology for improving integration has been considered as a key issue of memory technology.

Currently, 'NAND Flash' is widely used as a nonvolatile memory device in the industry. In the case of a NAND flash memory fabricated on the basis of a transistor structure, it is physically and technically difficult to reduce the transistor device to 7 nm or less in the long term, so there are difficulties in integration based on miniaturization.

In recent years, a structure capable of greatly increasing the memory capacity per area by stacking the conventional planar structure NAND flash in three dimensions has been proposed, and the possibility of increasing stagnant memory capacity due to the limitation of miniaturization has opened. However, there have been many problems and difficulties in developing the three-dimensional stacked structure, and researches on next generation memory are being actively carried out to overcome the limitations of NAND flash memory in this trend.

A resistive memory (ReRAM) having properties of high density, high integration, and low power is attracting attention as a future memory device that can take over the baton of NAND flash. The ReRAM uses a simple device structure (metal/resistance variable layer/metal), has the characteristics that information can be recorded according to the resistance state while increasing or decreasing electric resistance through an appropriate electric signal, and is very advantageous for incorporating a three-dimensional stacked structure with process advantages due to the simple structure as described above. Accordingly, the ReRAM is attracting attention as a memory with high integration density.

In particular, multi-level cell operation, which can store multiple bits in one cell, is known as an effective method for storing large amounts of data, and researches on ReRAM memory devices having multi-level cell operation characteristics are actively underway.

In addition, it is important to develop an orthogonal bar cell array (cross-bar array) having a $4F^2$ memory cell size for a highly integrated and ideal memory device configuration. However, an interference phenomenon occurs between adjacent cells due to the inherent characteristics of the orthogonal bar cell array. This causes an error in reading operation of data stored in the memory. To solve this problem, a selection device such as a diode or a transistor capable of selectively reading each cell is additionally provided for each cell. However, the integration of such a selection device integrated on or below a resistance variable layer leads to an increase in the cell size, with the disadvantage that a manufacturing process is very complicated, and there is a problem of practical limitation in achieving high integration.

Accordingly, researches on a memory device having a self-rectifying characteristic of a unit device structure so as not to need an additional selection device are being actively conducted.

CITATION LIST

Patent Literature

[Patent Literature 1]
Korean Patent Publication No. 10-2010-0087347

SUMMARY OF INVENTION

Technical Problem

A technical object of the invention is to provide a nonvolatile memory device having multi-level resistance and capacitance memory characteristics, and a manufacturing method thereof.

In addition, a technical object of the invention is to provide a nonvolatile memory device also having a self-rectifying characteristic, and a manufacturing method thereof.

The technical objects of the invention are not limited to the above-mentioned technical objects, and other technical objects which are not mentioned will become apparent to those skilled in the art from the following description.

Solution to Problem

To achieve the technical objects, according to an aspect of the invention, there is provided a nonvolatile memory device having multi-level resistance and capacitance memory characteristics. The nonvolatile memory device includes: a substrate; a first electrode that is provided on the substrate; a dielectric layer that is provided on the first electrode, has resistance and capacitance changed by a tunneling conduction phenomenon of charges according to an applied voltage, has rectifying characteristics, and includes a dielectric material; an active layer that is provided on the dielectric layer, has resistance and capacitance changed according to an applied voltage, and includes a graphene oxide complex; and a second electrode that is provided on the active layer, wherein the nonvolatile memory device has multi-level resistance and capacitance values according to an applied voltage.

In addition, the graphene oxide complex may include a graphene oxide layer, and metal oxide layer that is provided on the graphene oxide layer.

In addition, metal oxide of the metal oxide layer may be an oxide semiconductor material. In this case, the metal oxide layer may include iron oxide, titanium oxide, copper oxide, zinc oxide, tin oxide, or manganese oxide.

In addition, the dielectric layer may include $Si_3N_4$, $SiO_2$, $SiO_xN_y$, AlN or $Al_2O_3$.

In addition, the active layer may be formed on the dielectric layer by performing a solution process.

To achieve the technical objects, according to another aspect of the invention, there is provided a method for manufacturing a nonvolatile memory device. The method for manufacturing a nonvolatile memory device includes: a step of forming a first electrode on a substrate; a step of forming, on the first electrode, a dielectric layer that has resistance and capacitance changed by a tunneling conduction phenomenon of charges according to an applied voltage, has rectifying characteristics, and includes a dielectric material; a step of forming, on the dielectric layer, an active layer that has resistance and capacitance changed according to an applied voltage and includes a graphene oxide complex; and a step of forming a second electrode on the active layer, wherein the nonvolatile memory device has multi-level resistance and capacitance values according to an applied voltage.

In addition, the graphene oxide complex may include a graphene oxide layer, and a metal oxide layer that is provided on the graphene oxide layer.

In addition, the metal oxide layer may include iron oxide, titanium oxide, copper oxide, zinc oxide, tin oxide, or manganese oxide.

In addition, the step of forming the active layer may include forming the active layer including the graphene oxide complex by applying a solution including graphene oxide and metal oxide onto the dielectric layer.

Advantageous Effects of Invention

According to the invention, it is possible to provide the nonvolatile having multi-level resistance and capacitance memory characteristics.

Conventionally, a method for changing a resistance value of a low resistance state according to a maximum allowable current (current compliance) value set at the time of a SET operation has been proposed as a method for performing multi-level cell operation. The invention is a method for changing a resistance value and a capacitance value of a low resistance state according to the magnitude (+8 V, +12 V) of applied SET voltage, and has an advantage of simplifying a circuit since a separate maximum allowable current is not necessary.

In addition, the nonvolatile memory device according to the invention is embodied to also have a self-rectifying characteristic, thereby having an advantage of simplifying a structure and a process of an orthogonal bar cell array having a self-rectifying characteristic.

Accordingly, it is possible to prevent an error due to an interference current between adjacent cells even without an additional rectifying element, thereby achieving high integration and large capacity of a memory device.

It should be understood that the effects of the invention are not limited to the above effects and include all effects that can be deduced from the configuration of the invention described in Detailed Description or Claims of the invention.

DESCRIPTION OF EMBODIMENTS

Figure 1:
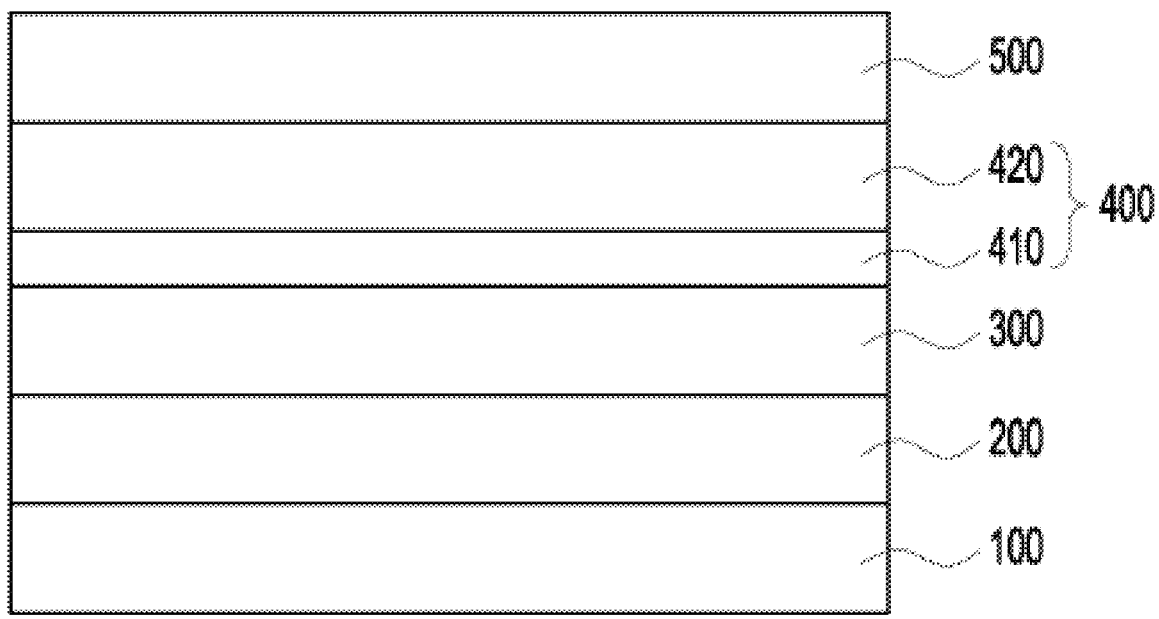
FIG. 1 is a cross-sectional view of a nonvolatile memory device having multi-level resistance and capacitance memory characteristics according to an embodiment of the invention.

Hereinafter, the invention will be described with reference to the accompanying drawings. However, the invention may be embodied in many different forms and should not be construed as limited to the embodiments set forth herein. In order to clearly illustrate the invention, parts not related to the description are omitted, and like parts are denoted by similar reference numerals throughout the specification.

Throughout the specification, when a part is referred to as being "connected (joined, coming in contact, coupled)" to another part, this includes not only "directly connected" but also "indirectly connected" with another member in between. In addition, when a part is referred to as "include" certain constituent elements, it means that it can further include other constituent elements, not excluding other constituent elements unless specifically stated otherwise.

The terms used herein are for the purpose of describing particular embodiments only and are not intended to be limiting the invention. The singular expressions include plural expressions unless the context clearly dictates otherwise. In this specification, the terms "include" or "have", etc., are intended to specify that the stated features, integers, steps, operations, elements, parts or combinations thereof are present, but it should be understood that existence or addition of one or more other features, numbers, steps, operations, components, parts or combinations thereof is not excluded in advance.

In addition, the term of "A/B/C multilayer structure" used in the invention means a structure in which a B layer and a C layer are sequentially positioned on an A layer.

A nonvolatile memory device having multi-level resistance and capacitance memory characteristics according to an embodiment of the invention will be described.

FIG. 1 is a cross-sectional view of a nonvolatile memory device having multi-level resistance and capacitance memory characteristics according to an embodiment of the invention.

Referring to FIG. 1, the nonvolatile memory device having multi-level resistance capacitance memory characteristics may include a substrate 100, a first electrode 200, a dielectric layer 300, an active layer 400, and a second electrode 500.

The substrate 100 may be any material that can serve as a support substrate. Meanwhile, such a substrate 100 may be an electrode substrate that can serve as an electrode. Accordingly, if the substrate 100 is an electrode substrate, the first electrode 200 described later can be omitted. For example, the electrode substrate may be an $n^+$-Si substrate.

The first electrode 200 is positioned on the substrate 100. The first electrode 200 may be any electrode material. For example, the first electrode 200 may include Ti, Al, or W. Meanwhile, as such a material of the first electrode 200, it is preferable to use a material having a difference in work function from a material of the second electrode 500 described later.

For example, the first electrode 200 may be formed using a sputtering method, an RF sputtering method, an RF magnetron sputtering method, a pulse laser deposition method, a chemical vapor deposition method, a plasma enhanced chemical vapor deposition method, an atomic layer deposition method, an electron beam deposition method, or a molecular beam epitaxy deposition method.

The dielectric layer 300 is positioned on the first electrode 200. Resistance of the dielectric layer 300 is changed by a tunneling conduction phenomenon of charges according to an applied voltage.

For example, the tunneling conduction phenomenon of charges may occur through defects generated in a thin film according to an applied voltage, and resistance and capacitance may be changed thereby.

Such a dielectric layer 300 may include a dielectric material. For example, the dielectric layer 300 may include $Si_3N_4$, $SiO_2$, $SiO_xN_y$, AlN, or $Al_2O_3$.

In addition, the dielectric layer 300 has a self-rectifying characteristic. For example, when the dielectric layer 300 is an $Si_3N_4$ layer, the $Si_3N_4$ layer in this case has a self-rectifying characteristic due to an asymmetric tunnel barrier of silicon nitride according to applied bias polarity.

Such a dielectric layer 300 may be formed using a sputtering method, an RF sputtering method, an RF magnetron sputtering method, a pulse laser deposition method, a chemical vapor deposition method, a plasma enhanced chemical vapor deposition method, an atomic layer deposition method, or a molecular beam epitaxy deposition method.

The active layer 400 is positioned on the dielectric layer 300. Such an active layer 400 may include a graphene oxide complex. For example, the graphene oxide complex may include a graphene oxide layer 410 and a metal oxide layer 420 positioned on the graphene oxide layer 410.

In this case, the metal oxide of the metal oxide layer 420 may be an oxide semiconductor material. Accordingly, the metal oxide layer 420 composed of the oxide semiconductor material is positioned between the graphene oxide layer 410 and the second electrode 500 described later, and it is possible to reduce interfacial resistance between the graphene oxide 410 and the second electrode 500 by the metal oxide layer 420. For example, the metal oxide layer 420 in this case may include iron oxide, titanium oxide, copper oxide, zinc oxide, tin oxide, or manganese oxide.

In such an active layer 400, resistance and capacitance are changed according to an applied voltage. The mechanism for this will be separately described later.

For example, such an active layer 400 may be formed using a solution process. For example, such an active layer 400 may be formed by performing a spin coating method.

The second electrode 500 is positioned on the active layer 400. The second electrode 500 may be any electrode material. For example, the second electrode 200 may include Ni or Ni/Au. The Ni/Au electrode in this case means a structure of an Ni layer and an Au layer positioned on the Ni layer.

Such a second electrode 500 may be formed using a sputtering method, an RF sputtering method, an RF magnetron sputtering method, a pulse laser deposition method, a chemical vapor deposition method, a plasma enhanced chemical vapor deposition method, an atomic layer deposition method, an electron beam deposition method, or a molecular beam epitaxy deposition method.

A method for manufacturing a nonvolatile memory device according to an embodiment of the invention will be described.

The method for manufacturing a nonvolatile memory device according to an embodiment of the invention includes: a step of forming a first electrode on a substrate; a step of forming, on the first electrode, a dielectric layer that has resistance and capacitance changed by a tunneling conduction phenomenon of charges according to an applied voltage, has a rectification characteristic, and includes a dielectric material; a step of forming, on the dielectric layer, an active layer that has resistance and capacitance changed according to an applied voltage and includes a graphene oxide complex; and a step of forming a second electrode on the active layer, wherein the nonvolatile memory device has multi-level resistance and capacitance values according to an applied voltage.

First, the first electrode may be formed on the substrate.

For example, the first electrode 200 may be formed using a sputtering method, an RF sputtering method, an RF magnetron sputtering method, a pulse laser deposition method, a chemical vapor deposition method, a plasma enhanced chemical vapor deposition method, an atomic layer deposition method, an electron beam deposition method, or a molecular beam epitaxy deposition method.

Then, a dielectric layer including a dielectric material may be formed on the first electrode.

For example, such a dielectric layer may be formed using a sputtering method, an RF sputtering method, an RF magnetron sputtering method, a pulse laser deposition method, a chemical vapor deposition method, a plasma enhanced chemical vapor deposition method, an atomic layer deposition method, an electron beam deposition method, or a molecular beam epitaxy deposition method.

Next, an active layer including a graphene oxide complex may be formed on the dielectric layer.

For example, the graphene oxide complex in this case may include a graphene oxide layer and a metal oxide layer positioned on the graphene oxide layer.

The active layer including such a graphene oxide complex may be formed by performing a solution process.

For example, in the step of forming the active layer, the active layer including the graphene oxide layer may be formed by applying a solution including graphene oxide and iron oxide onto the dielectric layer. When a solution including graphene oxide and iron oxide particles is applied onto the dielectric layer by using a solution process such as a spin coating method, the graphene oxide is deposited on the dielectric layer in a form of a thin film to form a graphene oxide layer, and iron oxide (FeO$_x$) nanoparticles are uniformly deposited on the graphene oxide surface to form a GO/FeO$_x$ thin film. In this case, the metal oxide layer forming the thin film in the form of nanoparticles on the graphene oxide layer may be a layer composed of metal oxide nanoparticles such as iron oxide, titanium oxide, copper oxide, zinc oxide, tin oxide, or manganese oxide.

Then, a second electrode may be formed on the active layer.

For example, the second electrode 500 may be formed using a sputtering method, an RF sputtering method, an RF magnetron sputtering method, a pulse laser deposition method, a chemical vapor deposition method, a plasma enhanced chemical vapor deposition method, an atomic layer deposition method, an electron beam deposition method, or a molecular beam epitaxy deposition method.

Production Example 1

A nonvolatile memory device according to an embodiment of the invention was manufactured.

Figure 2:
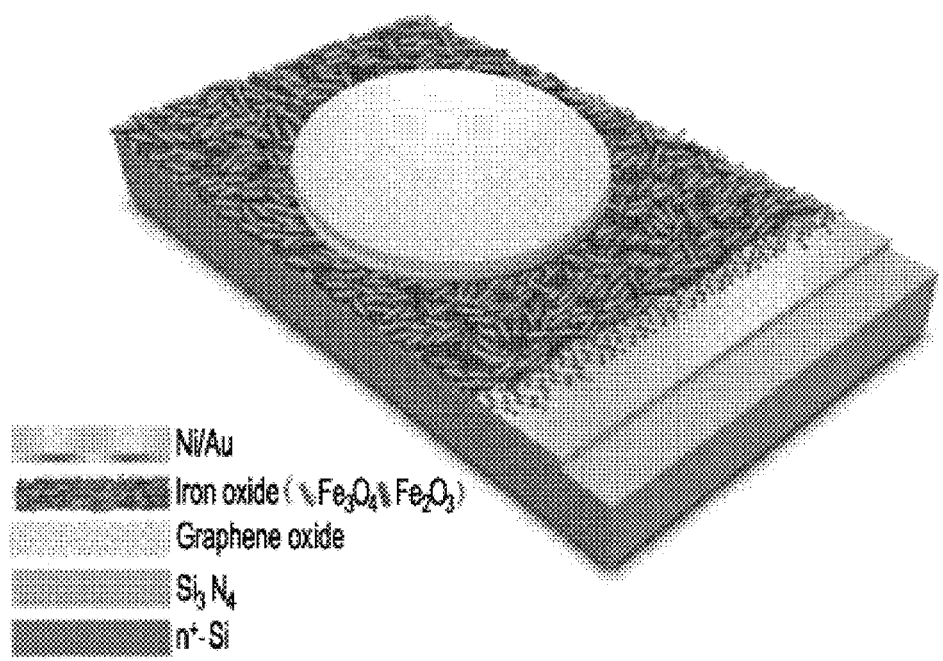
FIG. 2 is a schematic view of a nonvolatile memory device according to Production Example 1.

FIG. 2 is a schematic view of a nonvolatile memory device according to Production Example 1.

Referring to FIG. 2, as a structure of lower electrode substrate/dielectric layer/active layer/upper electrode, a structure of n$^+$-Si lower electrode substrate/Si$_3$N$_4$ dielectric layer/graphene oxide (GO)/iron oxide (FeO$_x$)/Ni/Au upper electrode was manufactured.

First, an Si$_3$N$_4$ dielectric layer with a thickness of 20 nm was formed on an n$^+$β-Si lower electrode substrate using a PECVD method.

Then, a mixed solution (FeO$_x$-GO solution) of graphene oxide and iron oxide is applied onto the Si$_3$N$_4$ layer using a spin coating method, the graphene oxide is deposited on the Si$_3$N$_4$ layer in the form of a thin film by density difference, and the iron oxide (FeO$_x$) forms another thin film in the form of nanoparticles on such a graphene oxide layer to form an active layer (GO/FeO$_x$).

More specifically, the mixed solution of graphene oxide and iron oxide is spin-coated and soft baking is performed to remove a solvent after application. Such soft baking was performed at 90° C. for about 10 minutes by using a hot plate. Then, annealing was performed at 90° C. for about 60 minutes in an oven.

Then, an Ni layer with a thickness of 40 nm/Au electrode with a thickness of 150 nm was formed on the active layer (GO/FeO$_x$) by e-beam evaporation by using a shadow mask.

Figure 3:
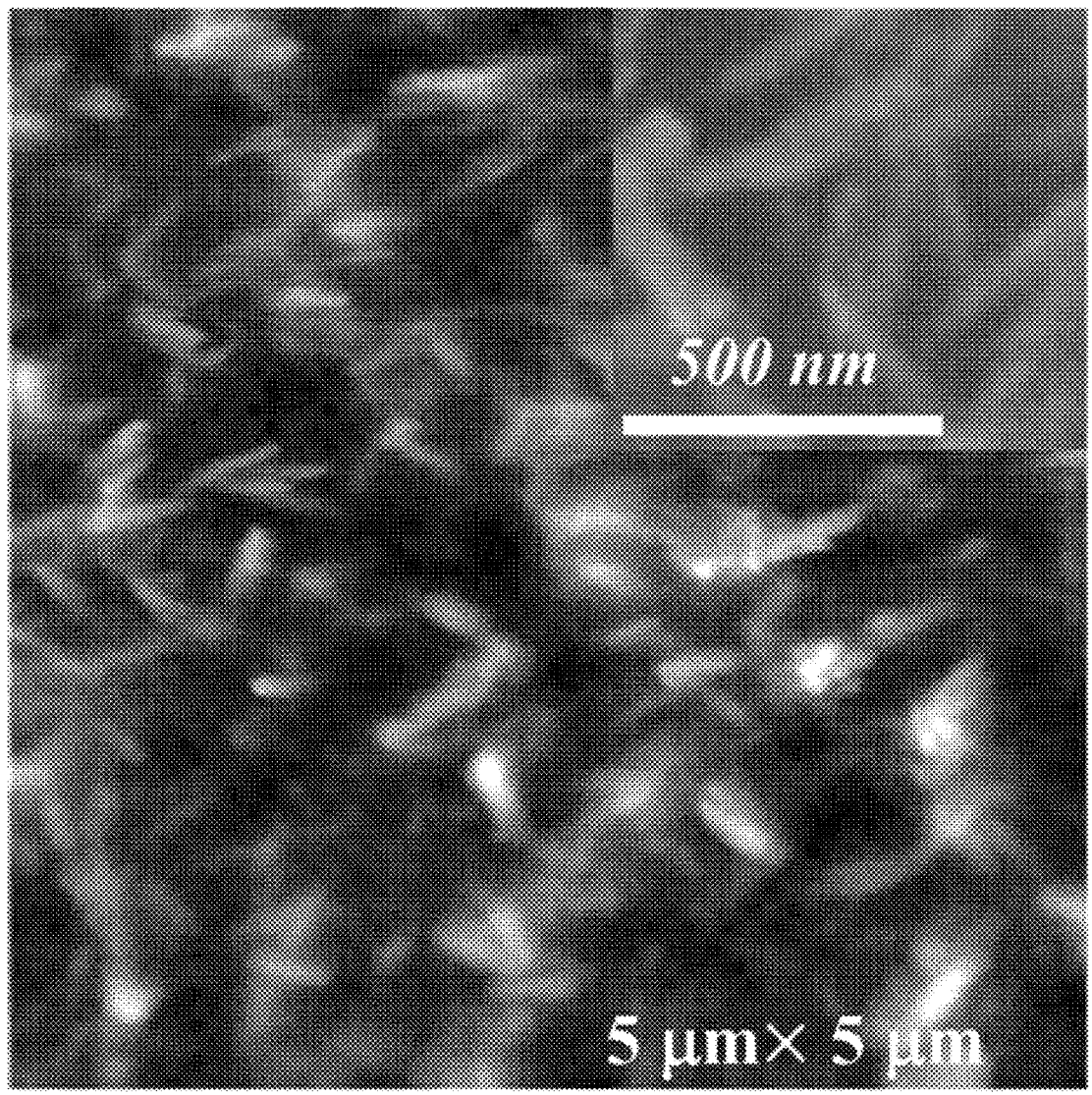
FIG. 3 is an AFM image of a GO/FeO$_x$ layer of the nonvolatile memory device according to Production Example 1.

FIG. 3 is an AFM image of the GO/FeO$_x$ layer of the nonvolatile memory device according to Production Example 1. Referring to FIG. 3, it can be seen that iron oxide forms a thin film in the form of nanoparticles on the graphene oxide layer.

Figure 4:
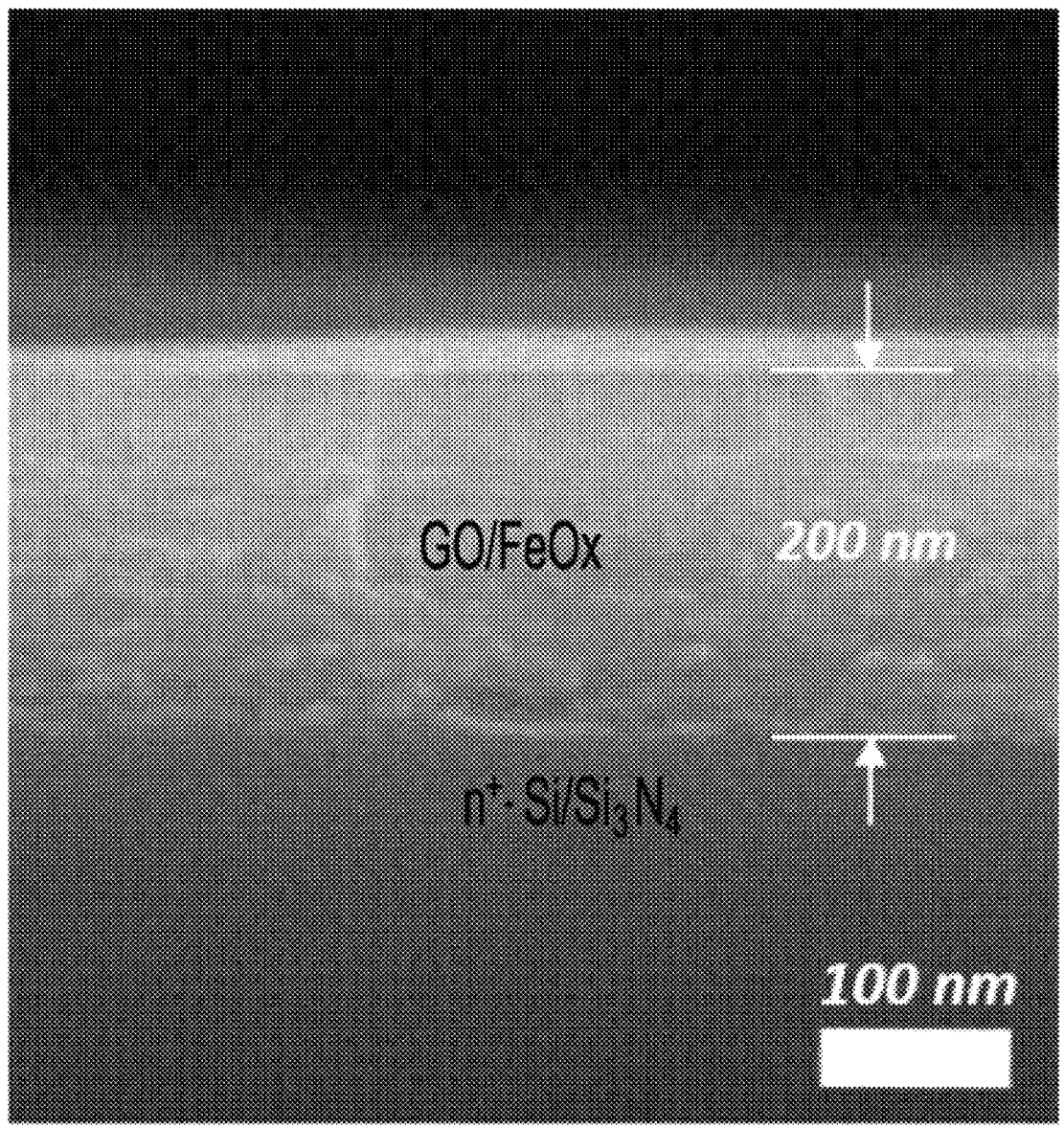
FIG. 4 is an SEM image of a GO/FeO$_x$ layer of the nonvolatile memory device according to Production Example 1.

FIG. 4 is an SEM image of the GO/FeO$_x$ layer of the nonvolatile memory device according to Production Example 1. Referring to FIG. 4, it can be seen that a GO/FeO$_x$ layer with a thickness of 200 nm is formed.

A mechanism having multi-level resistance and the capacitance characteristics will be described as an example of the structure of Production Example 1.

In the structure of n$^+$-Si/Si$_3$N$_4$/GO/FeO$_x$/Ni/Au of Production Example 1, first, referring to the active layer (GO/FeO$_x$), the iron oxide (FeO$_x$) layer has γ-Fe$_2$O$_3$ and Fe$_3$O$_4$ particles mixed in a predetermined ratio. In addition, oxygen ions (O$^{2-}$) are randomly distributed in the graphene oxide (GO) layer.

Properties of such an active layer may be changed between conductivity and non-conductivity according to polarity and magnitude of an applied voltage. It can be described that a SET state in which a certain level or more of positive voltage is applied is a conductive state in which resistance is decreased, and a RESET state in which a certain level or less of negative voltage is applied is a nonconductive state in which resistance is increased.

First, such resistance switching in the resistance change memory device based on graphene oxide can be caused by adsorption and desorption of oxygen ions present in the graphene oxide layer. When oxygen ions are depleted inside the graphene oxide, a disordered region is formed within a hexagonal graphene lattice, and it makes an electron trap state that can catch electrons. Resistance can be switched due to the formation of the path of the electrons formed in such an electron trap state.

When a positive voltage is applied to the upper electrode (Ni/Au) to reach predetermined magnitude of being the SET state, the electric field pushes the oxygen ions present in the graphene oxide toward the upper electrode, and holes are generated in the graphene oxide layer due to the movement of oxygen ions. Accordingly, in the graphene oxide, a conductive path such as metal is generated due to an increase in the charge concentration, and the graphene oxide layer has a high conductivity property. A plurality of such conductive paths may be formed in the graphene oxide.

In addition, when a positive voltage is applied to the upper electrode, oxygen ions are pushed out toward the upper electrode from γ-Fe$_2$O$_3$, and Fe$_3$O$_4$ becomes dominant in the iron oxide thin film. Conductive Fe$_3$O$_4$ ions are abundantly present in the iron oxide layer as a boundary layer between the upper electrode and the graphene oxide layer, and electrons have active conductivity through Fe$_3$O$_4$. Accordingly, conductive filaments can be easily formed. The graphene oxide layer is a form in which sp$^2$ is dominantly combined in the form of a two-dimensional hexagon.

Accordingly, when a positive voltage is applied, a conductive path such as metal is formed between the upper and lower electrodes due to reduction reaction of iron oxide and an empty grid point of oxygen ions occurring in the graphene oxide layer.

The resistance change reaction described above occurs by oxidation and reduction reactions between Fe$_3$O$_4$ and γ-Fe$_2$O$_3$, the reaction formula of which can be represented as follows.

$$2Fe_3O_4 + O^{2-} \leftrightarrow 3\gamma\text{—}Fe_2O_3 + 2e^-$$ [Reaction Formula 1]

In the graphene oxide layer/iron oxide layer, it can be divided into a conductive state in which Fe$_3$O$_4$ is dominant and an insulating state in which γ-Fe$_2$O$_3$ is dominant.

The characteristics of the memory device may be changed to have conductivity or insulation by oxidation and reduction reactions according to the movement of oxygen ions occurring in the iron oxide layer as described above.

In addition, another conductive path may be formed between iron oxide and graphene oxide. The it orbital of C—O bonds in the graphene oxide is more limited and interact with Fe, and interaction of the d-π orbital may occur thereby. Ions playing a functional role of including oxygen are suitable for reaction with Fe ions, so there is a large-scale coupling among Fe—C—O, which forms a charge transfer channel between C2p and Fe3d states.

As the conductive filament is formed in the interfacial layer between the iron oxide layer and the graphene oxide layer, electrons are transferred between C2p-Fe3d states, and the resistance state of the active layer may be switched to a low resistance state due to the formation of the filament-type path formed in the graphene oxide layer and the iron oxide layer.

When a negative voltage is applied through the upper electrode, oxygen ions ($O^{2-}$) move from the upper electrode to the iron oxide thin film with dominant $Fe_3O_4$ and graphene oxide. In this case, the interfacial layer becomes a non-conductive state with dominant $\gamma$-$Fe_2O_3$, thereby being a state in which the conductive channel is disconnected. Simultaneously, oxygen ions are attached to graphene oxide, and the graphene oxide forms a two-dimensional hexagonal shape in an $sp^a$ state. Accordingly, the conductive channels formed in graphene oxide and the interfacial layer are partially disconnected, and resistance is rapidly increased. In other words, the nano-scale conductive filaments formed in the SET state are broken, and the resistance state of the active layer is switched to the high resistance state.

Meanwhile, in the structure of $n^+$—Si/$Si_3N_4$/GO/$FeO_x$/Ni/Au, resistance switching in the $Si_3N_4$ layer is generated by a tunneling conduction phenomenon of charges through defects caused in the $Si_3N_4$ thin film. When $V_{SET\_LRS}$ is applied, defects such as Si-dangling bond are formed in the thin film, and the defects generate an energy level in a band gap. Accordingly, since two-step tunneling conduction occurs and the movement of charges becomes easy, a significant tunneling current is present in the $Si_3N_4$ thin film. The current increase by the trap-assisted tunneling causes resistance switching of $Si_3N_4$.

Meanwhile, when a negative voltage is applied, charges cannot tunnel $Si_3N_4$ due to high tunneling barrier height of $Si_3N_4$. Accordingly, when a negative voltage is increased constantly, electrons trapped in the trap state of $Si_3N_4$ is de-trapped and the resistance switching from the low resistance state to the high resistance state is possible.

Figure 5:
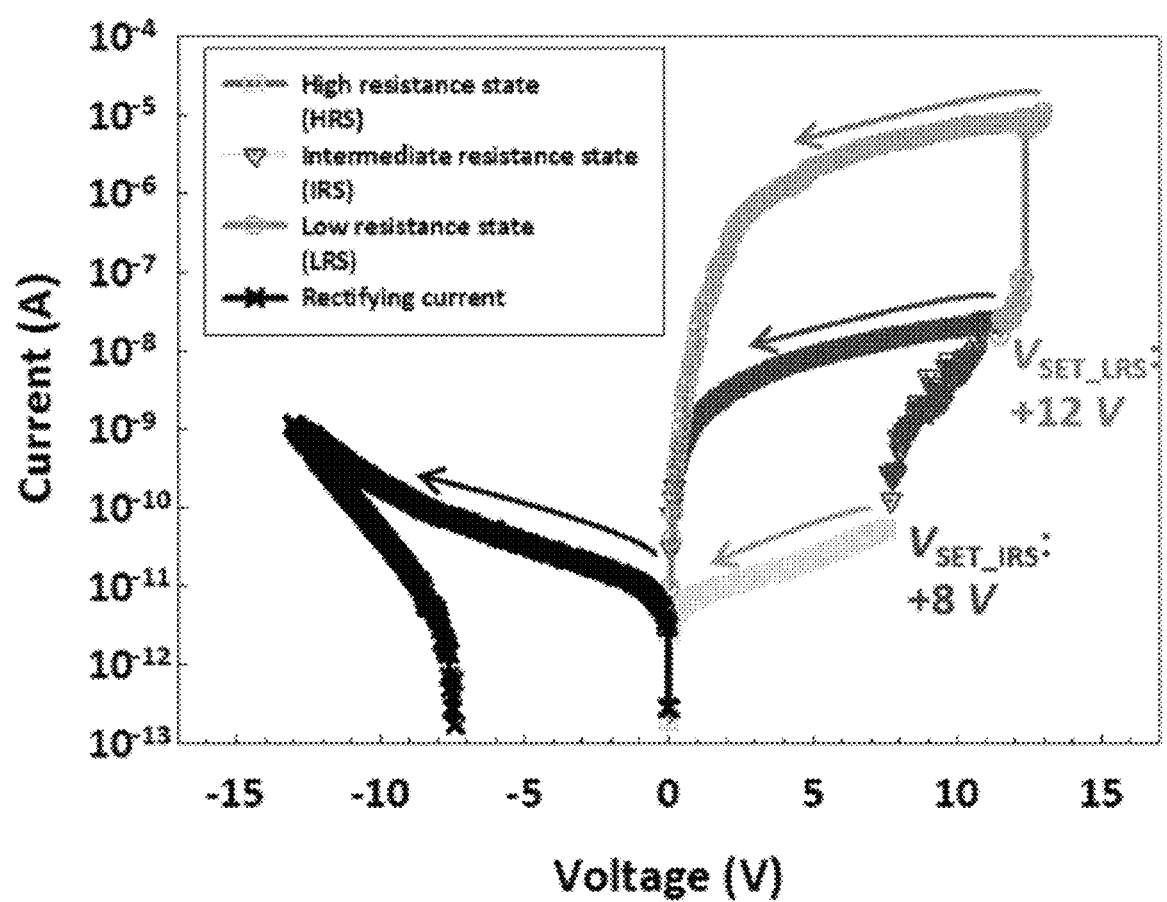
FIG. 5 is a graph illustrating I-V characteristics of the nonvolatile memory device according to Production Example 1.

FIG. 5 is a graph illustrating I-V characteristics of the nonvolatile memory device according to Production Example 1.

Referring to FIG. 5, the $n^+$—Si electrode substrate is connected to the ground, and applies a positive voltage to the Ni/Au electrode. When a positive voltage of +8 V is applied to the Ni/Au electrode, a current is suddenly increased. The change in current means that the resistance is changed from the high resistance state (HRS) to an intermediate resistance state (IRS), and the voltage in this case is defined as a SET_IRS voltage ($V_{SET\_IRS}$).

In addition, when the positive voltage is increased to +12 V or higher, the current is suddenly increased again. The change in current means that the device is switched from the intermediate resistance state to the low resistance state (LRS), and the voltage in this case is defined as a SET_LRS voltage ($V_{SET\_LRS}$).

Meanwhile, when a negative voltage is applied to the Ni/Au electrode, a phenomenon that the current is suppressed to 100 pA or less occurs. This represents that a device cell itself has an internal rectifying characteristic. In other words, an asymmetric tunnel barrier effect of $Si_3N_4$ occurs due to the use of other upper and lower electrodes in a work function, and a tunnel barrier height of $Si_3N_4$ is changed according to applied bias polarity.

Accordingly, when a negative voltage is applied, the high tunnel barrier is formed to represent a self-rectifying characteristic.

In addition, for uniform and stable operation characteristics of the device, complete RESET (switching phenomenon from the low resistance state to the high resistance state) of the active layer is necessary, and to this end, it is necessary to apply a sufficient negative voltage of –10 V.

Figure 6:
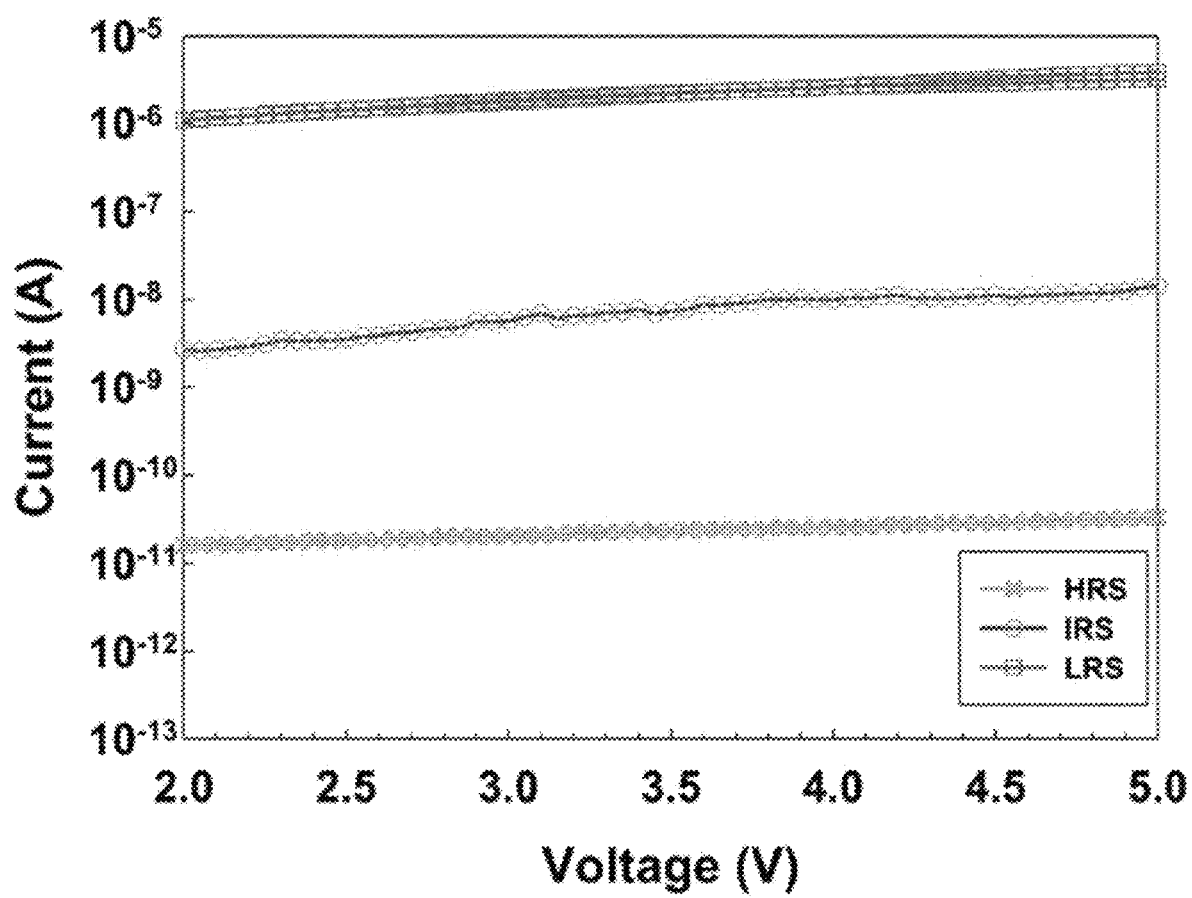
FIG. 6 is a graph illustrating a current value according to a resistance state of the nonvolatile memory device according to Production Example 1.

FIG. 6 is a graph illustrating a current value according to a resistance state of the nonvolatile memory device according to Production Example 1.

Table 1 represents a resistance value between a SET voltage ($V_{SET}$) value and +2.0 V in the HRS, IRS, and LRS states.

TABLE 1

| State | SET Voltage ($V_{SET}$) | Resistance read at + 2.0 V($\Omega$) |
|---|---|---|
| HRS (High resistance state) | — | $1.2 \times 10^{11}$ |
| IRS (Intermediate resistance state) | +8.0 | $7.4 \times 10^{8}$ |
| LRS (Low resistance state) | +12.0 | $1.8 \times 10^{6}$ |

Referring to FIG. 6 and Table 1, it can be seen that the resistance values are of different levels from each other in the HRS, IRS, and LRS states. Accordingly, it can be known that the nonvolatile memory device according to Production Example 1 has multi-level resistance values.

Figure 7:
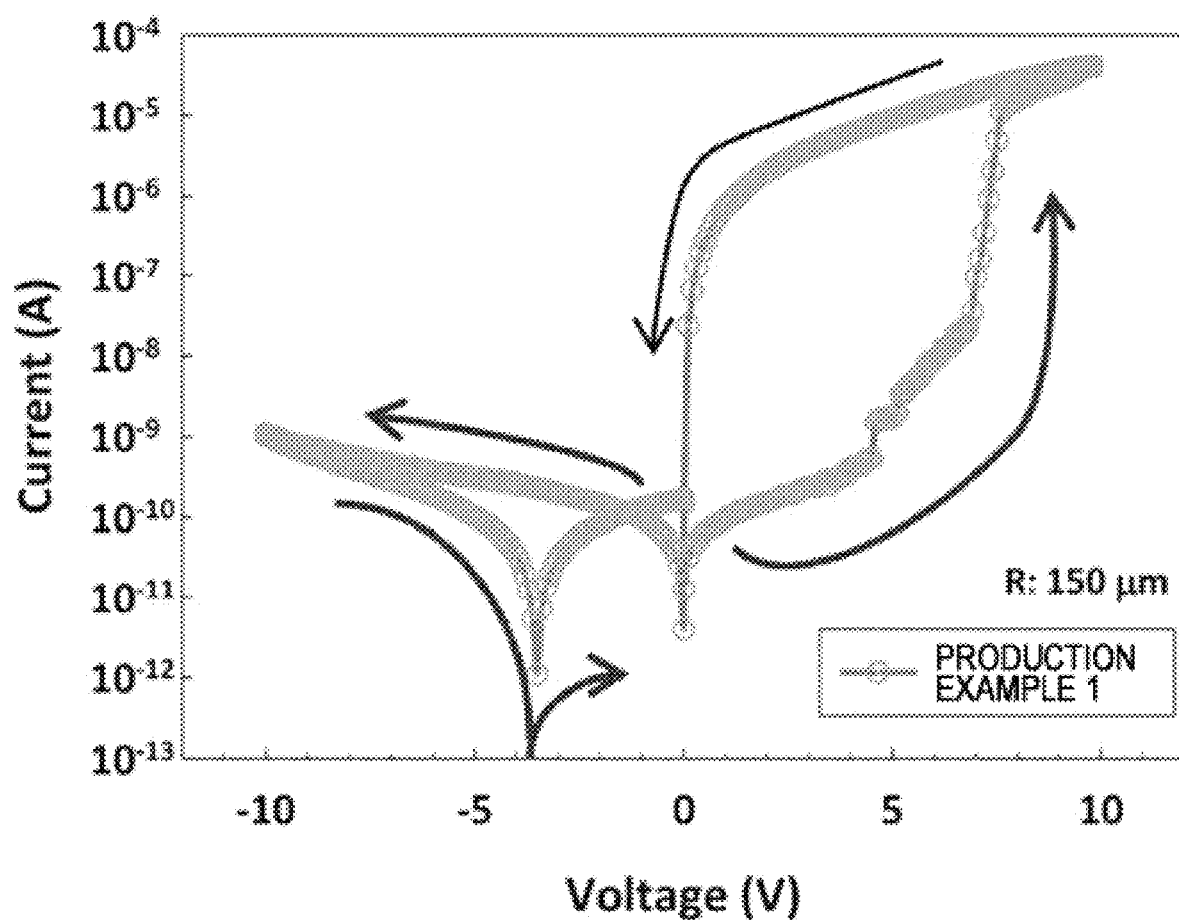
FIG. 7 is a graph illustrating I-V characteristics of the non-volatile memory device according to Production Example 1.

FIG. 7 is a graph illustrating I-V characteristics of the nonvolatile memory device according to Production Example 1.

Referring to FIG. 7, I-V characteristics of the nonvolatile memory device were measured while voltage sweep is performed from –10 V to +10 V.

Figure 8:
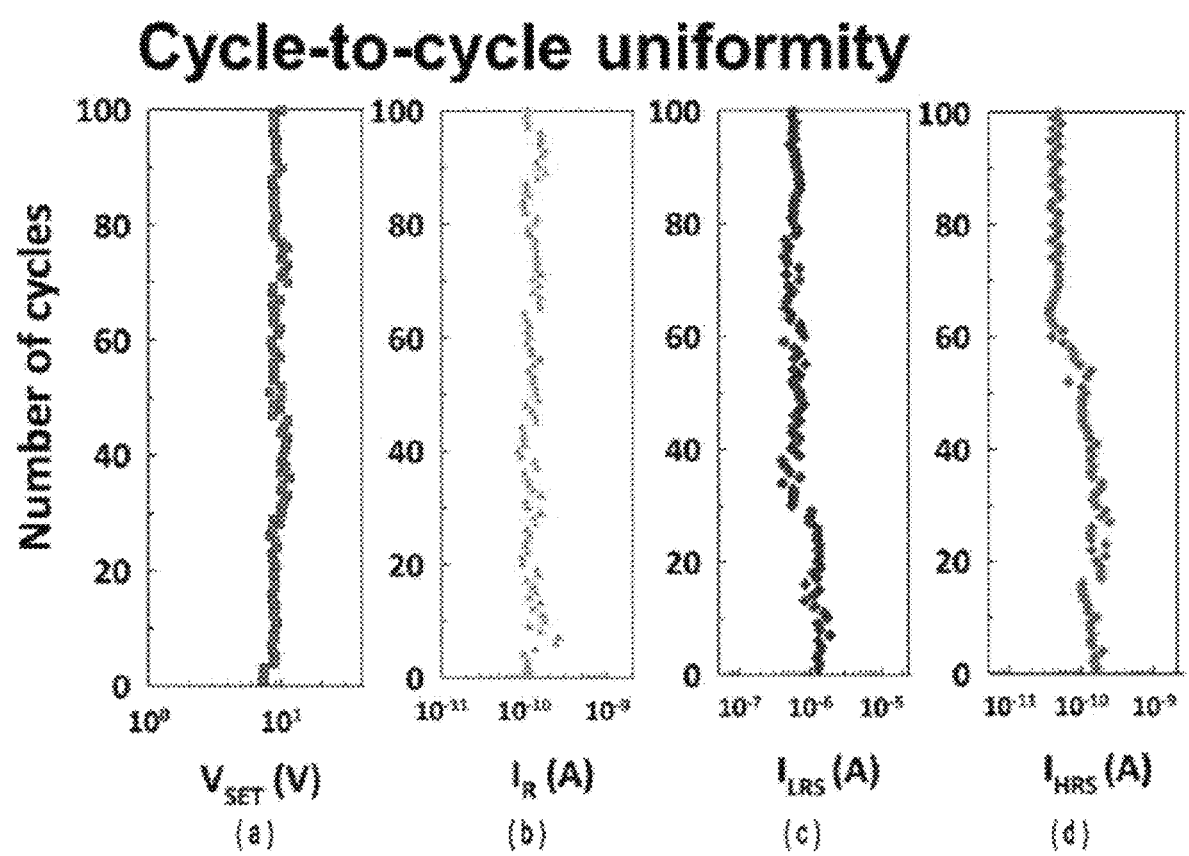
FIG. 8 is graphs obtained by measuring cycle-to-cycle variation of $V_{SET}$, $I_R$, $I_{LRS}$, and $I_{HRS}$ values of the nonvolatile memory device according to Production Example 1.

FIG. 8 is graphs obtained by measuring cycle-to-cycle variation of $V_{SET}$, $I_R$, and $I_{HRS}$ values of the nonvolatile memory device according to Production Example 1.

Referring to FIG. 8, the LRS current ($I_{LRS}$) and the HRS current ($I_{HRS}$s) were read at 1.5 V, and the rectifying current ($I_R$) was read at –1.5 V.

Referring to FIG. 8, it can be known that the $V_{SET}$, $I_R$, and $I_{HRS}$ values of the nonvolatile memory device according to Production Example 1 exhibit excellent uniformity even when the number of cycle times is increased.

In addition, it can be seen that an LRS/HRS current ratio ($I_{LRS}/I_{HRS}$) and a rectifying ratio ($I_{LRS}/I_R$) are higher than $10^4$. Particularly, such a large rectifying ratio helps to suppress a parasitic sneak current.

Figure 9:
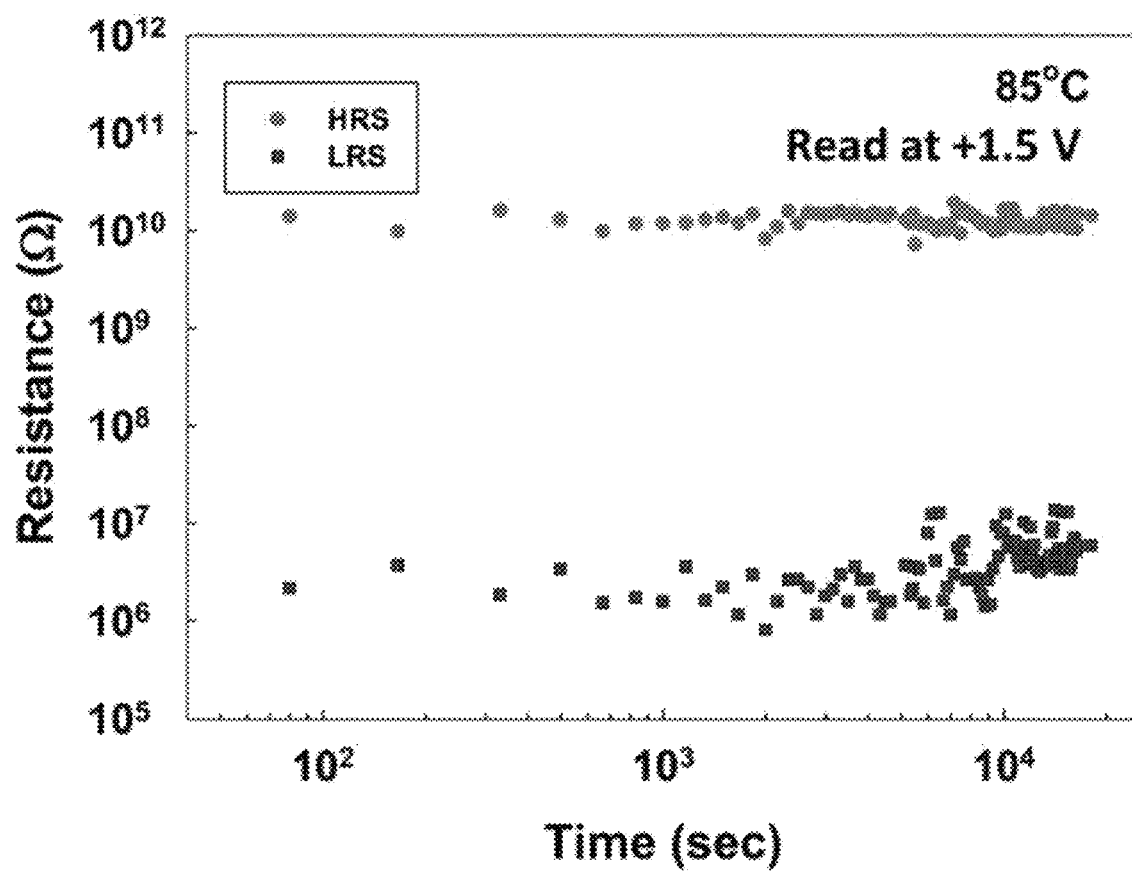
FIG. 9 is a graph illustrating retention characteristics of the nonvolatile memory device according to Production Example 1.

FIG. 9 is a graph illustrating retention characteristics of the nonvolatile memory device according to Production Example 1.

Referring to FIG. 9, resistance values were read at +1.5 V while the nonvolatile memory device according to Production Example 1 were put at 85° C. for 5 hours or more. Referring to FIG. 9, it can be seen that the HRS resistance value and the LRS resistance value are stable during measurement.

FIG. 10 to FIG. 13 are graphs illustrating impedance spectra according to the resistance states of the nonvolatile memory device according to Production Example 1.

Figure 10:
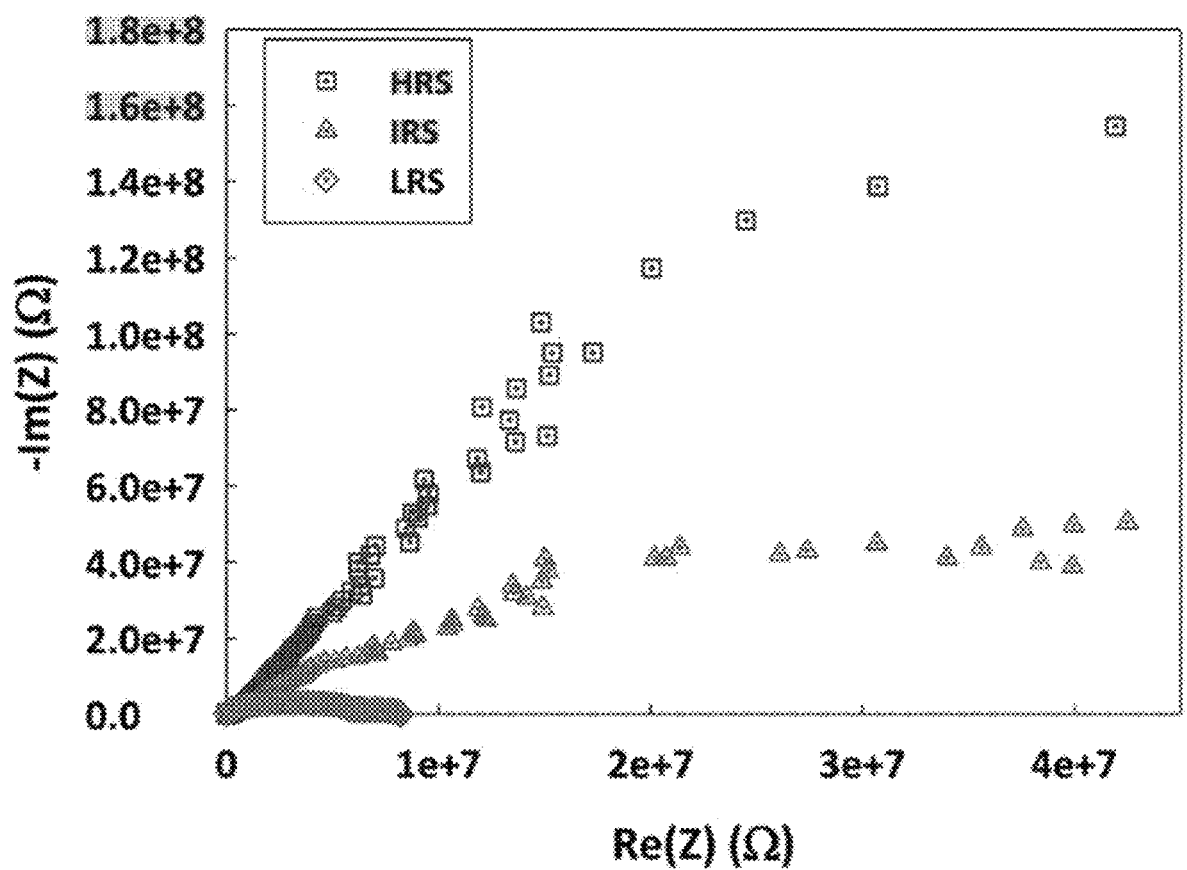
FIG. 10 to FIG. 13 are graphs illustrating impedance spectra according to a resistance state of the nonvolatile memory device according to Production Example 1.

FIG. 10 illustrates impedance spectra in the HRS state, the IRS state, and the LRS state. In addition, FIG. 11, FIG. 12, and FIG. 13 illustrate impedance spectra in the HRS state, the IRS state, and the LRS state, respectively.

Figure 11:
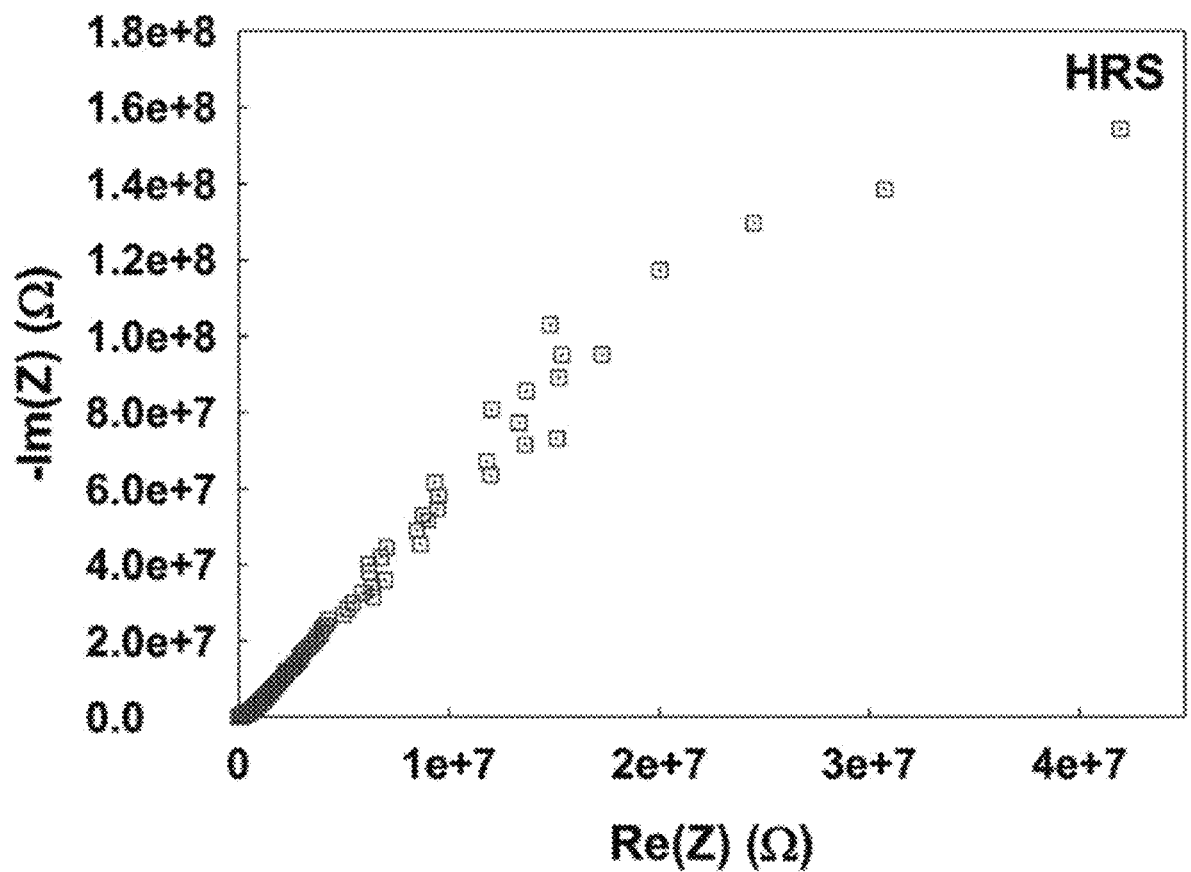
Figure 12:
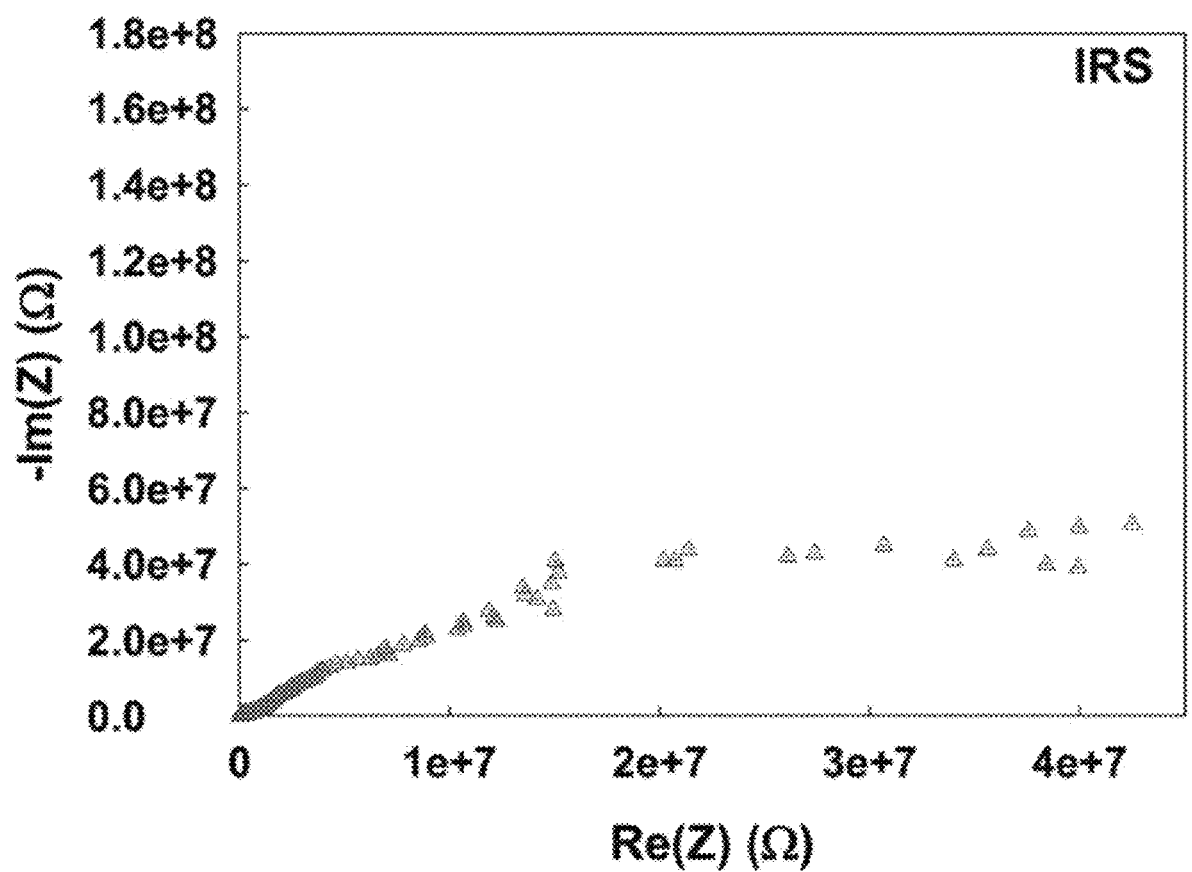
Figure 13:
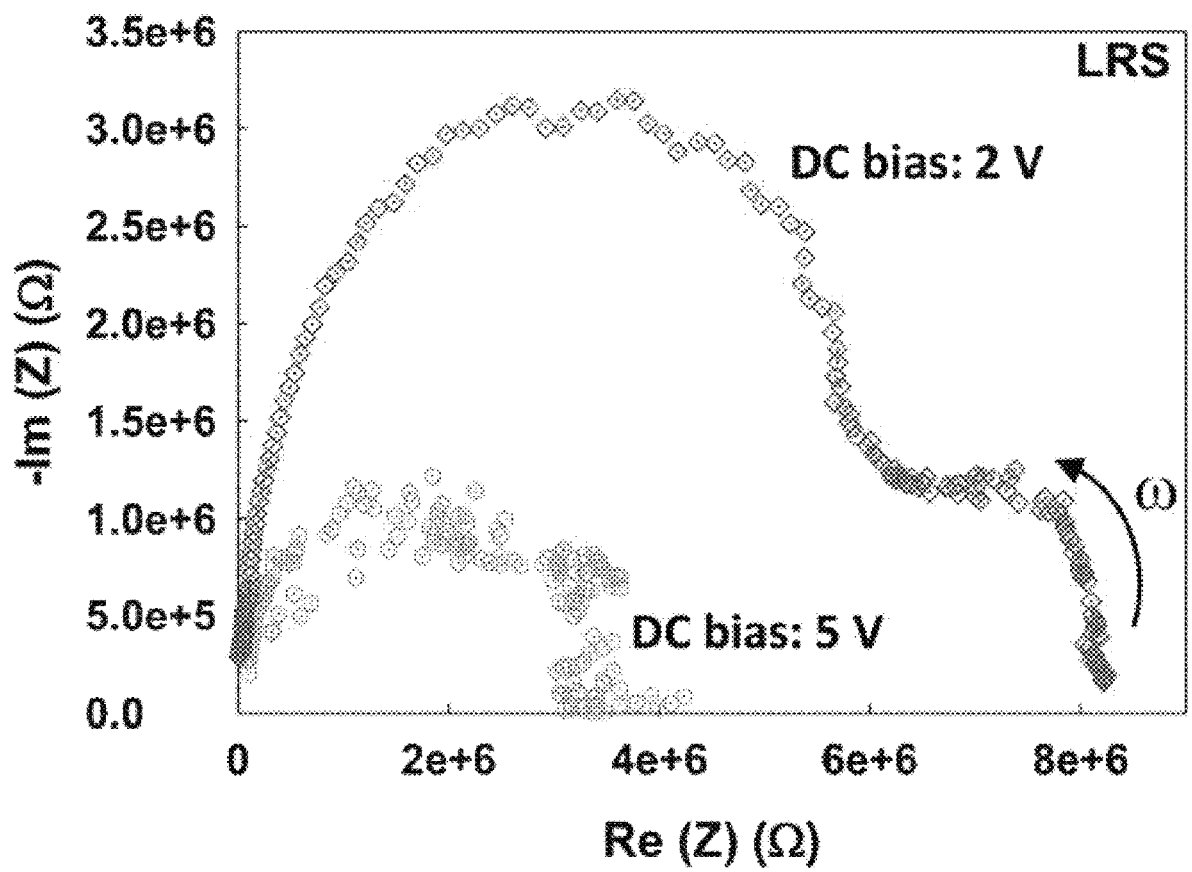

Referring to FIG. 11 to FIG. 13, it can be known that impedance characteristics are changed according to three resistance states of the device.

Figure 14:
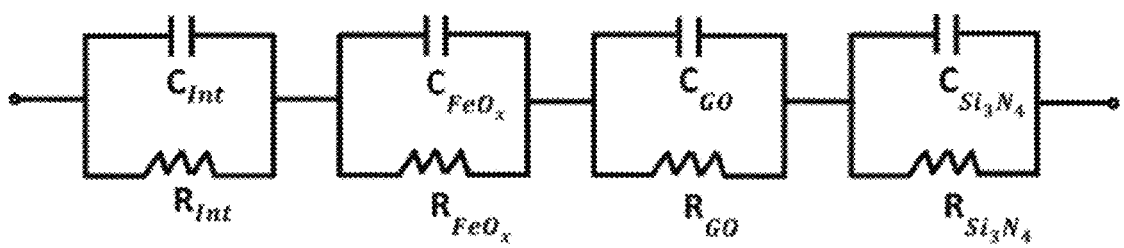
FIG. 14 is an equivalent circuit diagram corresponding to the nonvolatile memory device according to Production Example 1.

FIG. 14 is an equivalent circuit diagram corresponding to the nonvolatile memory device according to Production Example 1.

Referring to FIG. 14, in the nonvolatile memory device according to Production Example 1, the $Si_3N_4$ layer, the GO layer, the $FeO_x$ layer, and an interface (Int) of the $FeO_x$ layer and the Ni/Au electrode are disposed in parallel, each of which corresponds to a circuit having R and C values. In this case, it is expected that oxygen of the $FeO_x$ layer and Ni of the Ni/Au electrode will form nickel oxide in the interface (Int) of the $FeO_x$ layer and the Ni/Au electrode, and an equivalent circuit diagram was configured by considering the interface (Int) of the $FeO_x$ layer and the Ni/Au electrode in this case.

Figure 15:
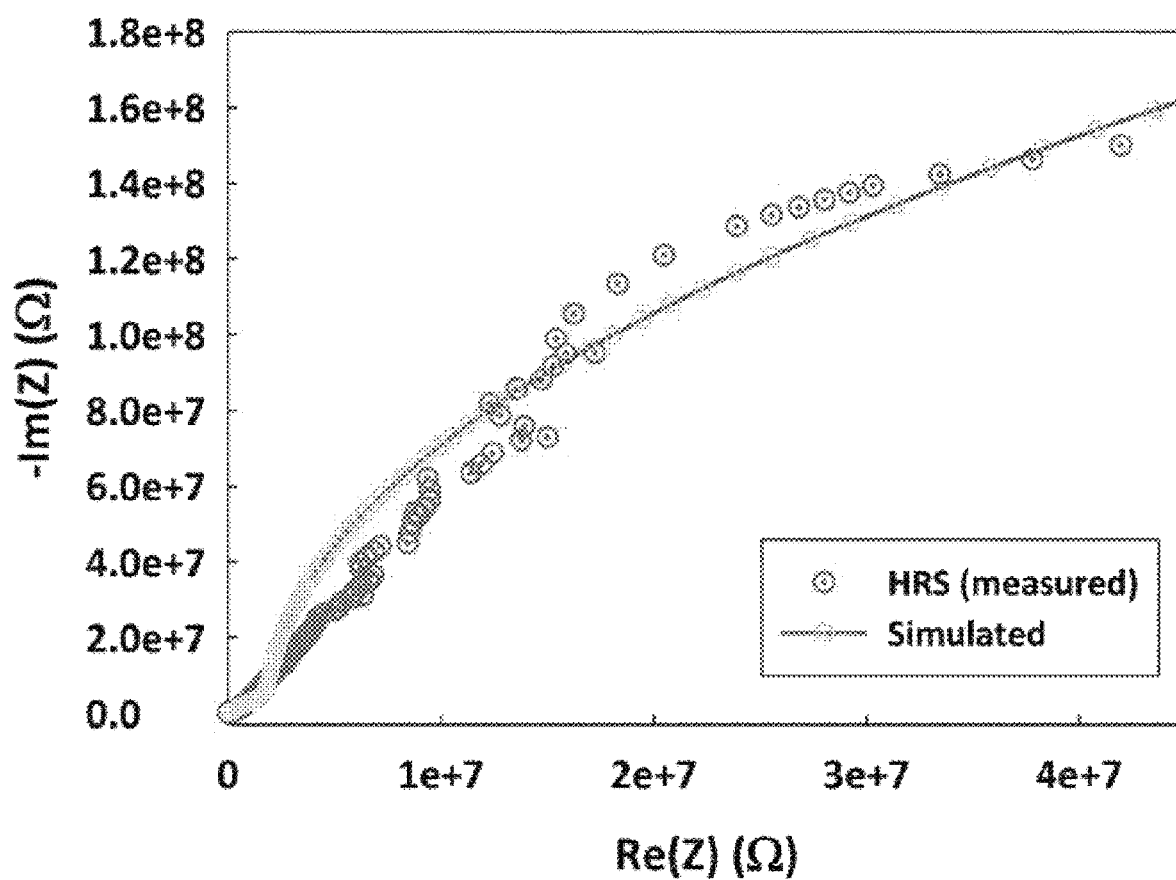
FIG. 15 to FIG. 17 are graphs obtained by simulating impedance spectra according to a resistance state of the nonvolatile memory device according to Production Example 1 on the basis of a device equivalent circuit.
Figure 16:
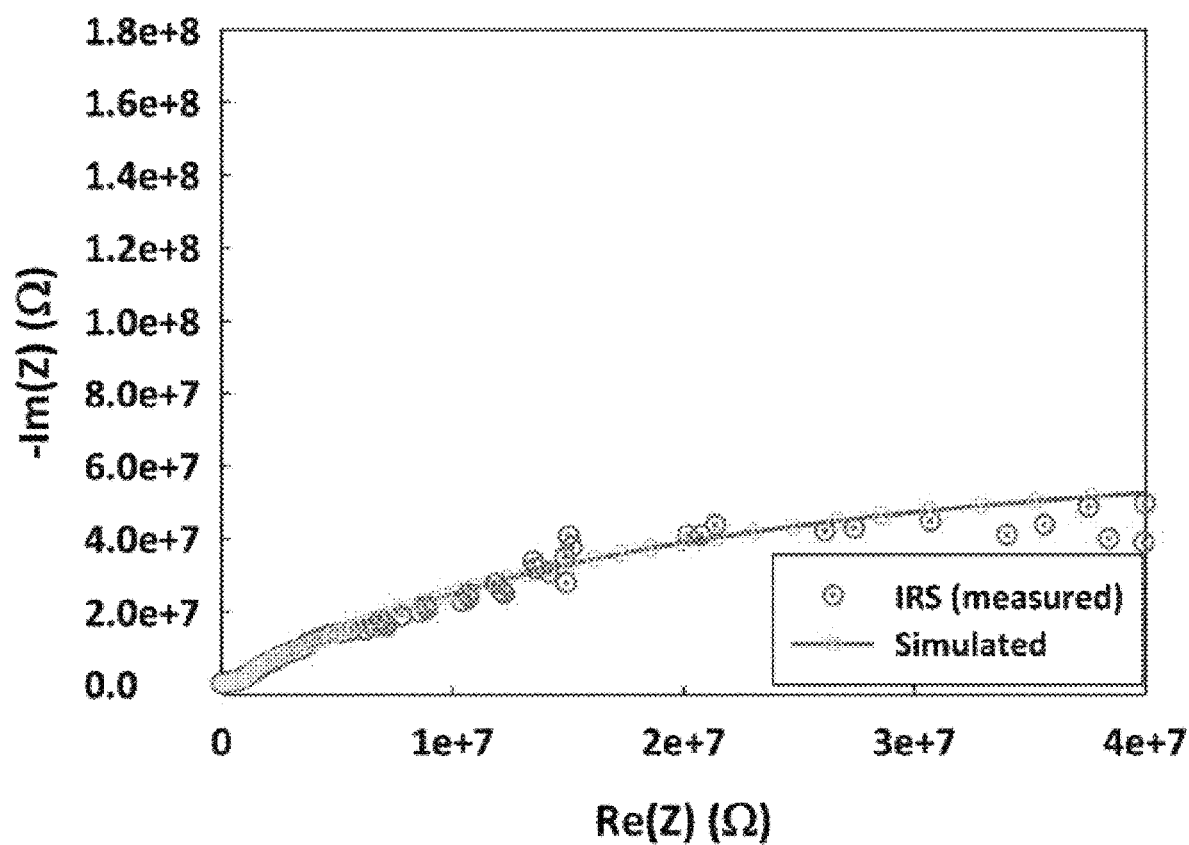
Figure 17:
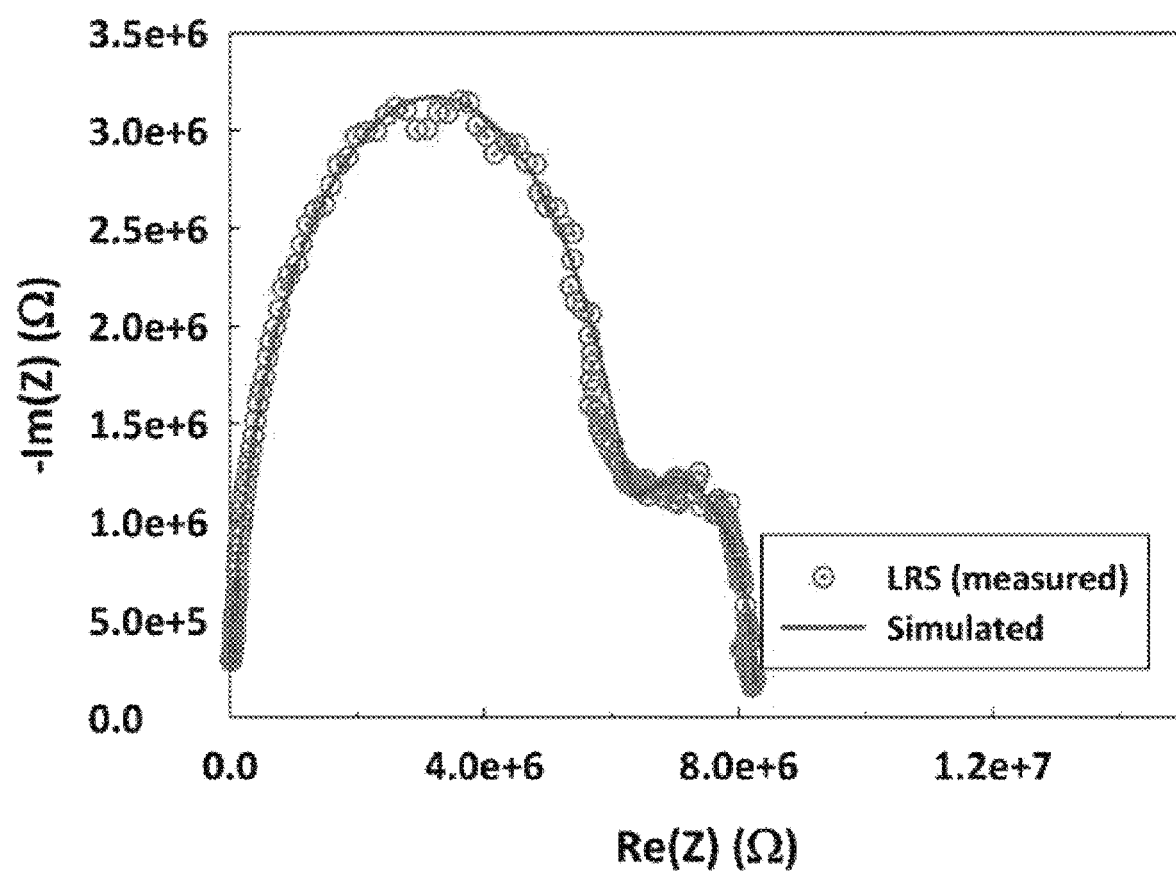

FIG. 15 to FIG. 17 are graphs obtained by simulating impedance spectra according to the resistance state of the nonvolatile memory device according to Production Example 1 on the basis of a device equivalent circuit.

Referring to FIG. 15, it can be seen that impedance spectra measured in the HRS state of the nonvolatile memory device according to Production Example 1 coincide with impedance spectra through the simulation using the equivalent circuit illustrated in FIG. 14.

Referring to FIG. 16, it can be seen that impedance spectra measured in the IRS state of the nonvolatile memory device according to Production Example 1 coincide with impedance spectra through the simulation using the equivalent circuit illustrated in FIG. 14.

Referring to FIG. 17, it can be seen that impedance spectra measured in the LRS state of the nonvolatile memory device according to Production Example 1 coincide with impedance spectra through the simulation using the equivalent circuit illustrated in FIG. 14.

Figure 18:
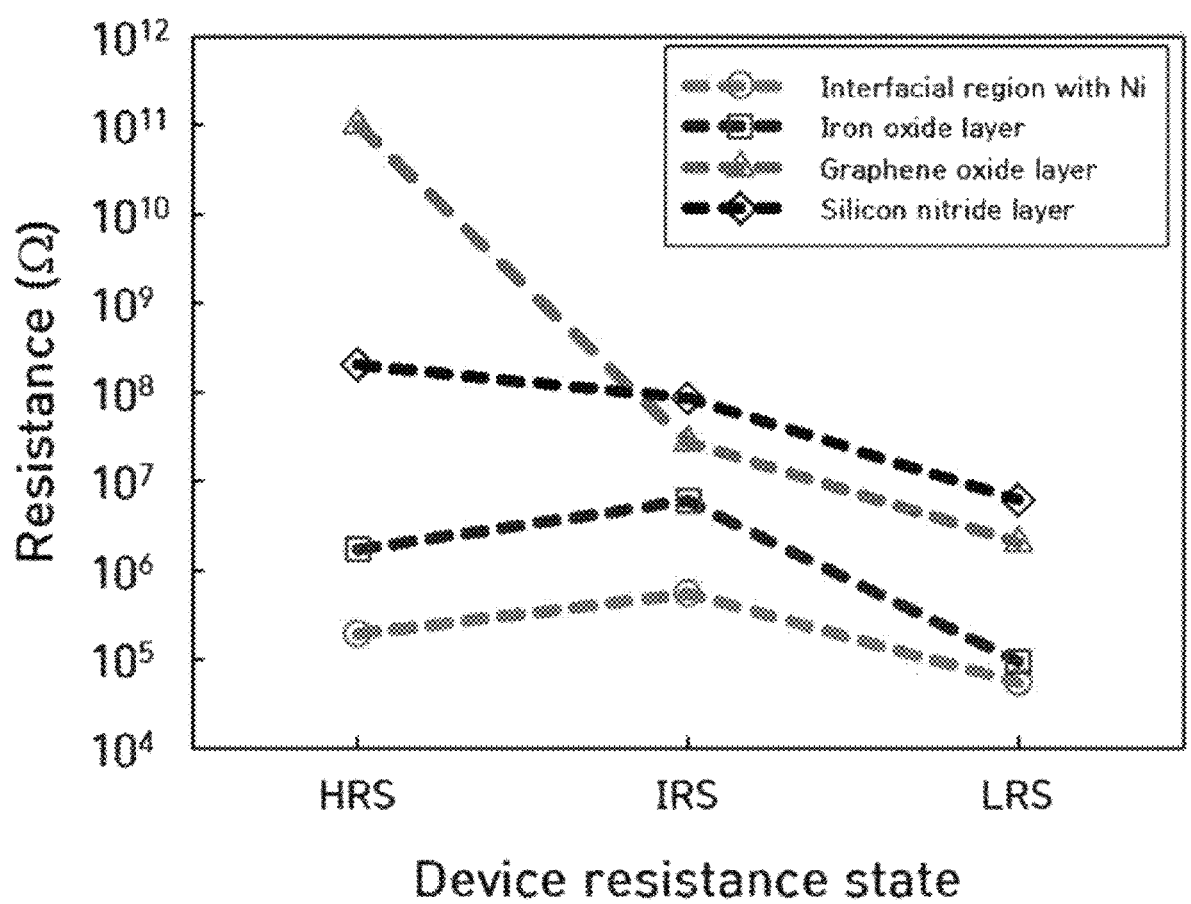
FIG. 18 is a graph illustrating a resistance value according to a resistance state of the nonvolatile memory device according to Production Example 1.

FIG. 18 is a graph illustrating a resistance value according to a resistance state of the nonvolatile memory device according to Production Example 1. In other words, FIG. 18 is a graph illustrating resistance values of the interface region (with Ni), the $FeO_x$ layer (iron oxide layer), the GO layer (graphene oxide layer), and $Si_3N_4$ layer (silicon nitride layer) in the HRS, IRS, and LRS state of the nonvolatile memory device according to Production Example 1.

Figure 19:
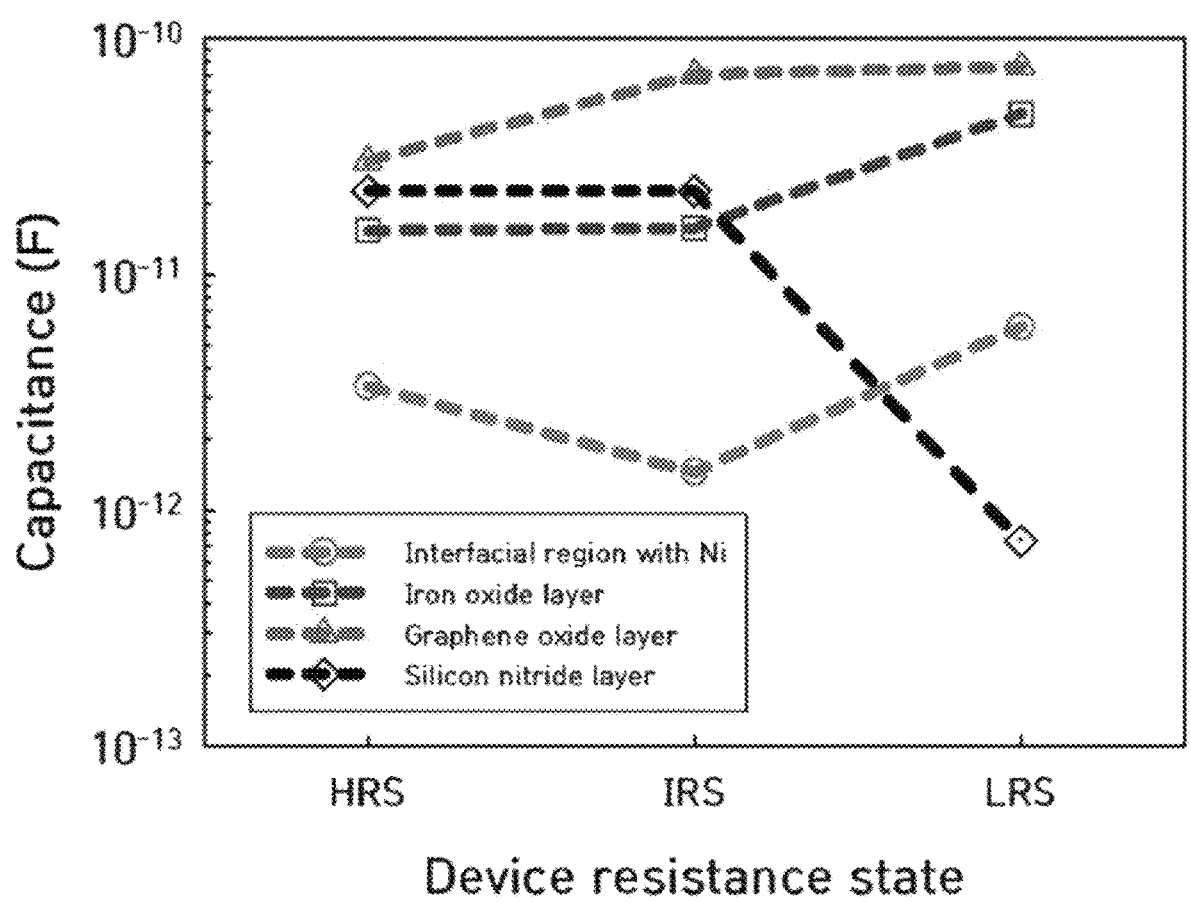
FIG. 19 is a graph illustrating a capacitance value according to a resistance state of the nonvolatile memory device according to Production Example 1.

In addition, FIG. 19 is a graph illustrating a capacitance value according to a resistance state of the nonvolatile memory device according to Production Example 1. In other words, FIG. 19 is a graph illustrating capacitance values of the interface region (with Ni), the $FeO_x$ layer (iron oxide layer), the GO layer (graphene oxide layer), and $Si_3N_4$ layer (silicon nitride layer) in the HRS, IRS, and LRS state of the nonvolatile memory device according to Production Example 1.

In addition, Table 2 is a table illustrating resistance values and capacitance values of the interface region (with Ni), the $FeO_x$ layer. the GO layer, and the $Si_3N_4$ layer using impedance spectra in the HRS, IRS, and LRS states.

region (with Ni), the $Si_3N_4$ layer, the GO layer, and the $FeO_x$ layer is changed according to the resistance state.

According to the invention, it is possible to provide the nonvolatile memory device having multi-level resistance and capacitance memory characteristics.

Conventionally, as a method for multi-level cell operation, a method of changing a resistance value of a low resistance state according to the maximum allowable current (current compliance) set at the time of SET operation has been proposed. In the invention, since the method of changing the resistance value and the capacitance value of the low resistance state according to magnitude (+8 V, +12 V) of applied SET voltage does not need a separate maximum allowable current, there is an advantage that a circuit is simple.

In addition, the invention suggests a simple device structure of the nonvolatile memory having a self-rectifying characteristic to have an advantage that a structure and a process of an orthogonal bar cell array having a self-rectifying characteristic can be simple. In addition, it is possible to prevent an error due to an interference current between adjacent cells even without an additional rectifying element, thereby achieving high integration and large capacity of a memory device.

It will be understood by those skilled in the art that the foregoing description of the invention is for illustrative purposes only, and that those skilled in the art can readily understand that various changes and modifications may be made without departing from the spirit or essential characteristics of the invention. Therefore, it should be understood that the above-described embodiments are illustrative in all aspects and not restrictive. For example, each component described as a single entity may be distributed and implemented, and components described as being distributed may also be implemented in a combined form.

The scope of the invention is defined by appended Claims, and all changes or modifications derived from the meaning and scope of Claims and their equivalents should be construed as being included within the scope of the invention.

REFERENCE SIGNS LIST

100: SUBSTRATE
200: FIRST ELECTRODE
300: DIELECTRIC LAYER
400: ACTIVE LAYER

TABLE 2

| Resistance state | Resistance | | | | Capacitance | | | |
| --- | --- | --- | --- | --- | --- | --- | --- | --- |
| | Interface region with Ni | $FeO_x$ | GO | $Si_3N_4$ | Interface region with Ni | $FeO_x$ | GO | $Si_3N_4$ |
| HRS | 0.189 MΩ | 1.704 MΩ | 99.960 MΩ | 204 MΩ | 3.344 pF | 15.415 pF | 30.404 pF | 22.600 pF |
| IRS | 0.543 MΩ | 5.967 MΩ | 27.122 MΩ | 84.623 MΩ | 1.449 pF | 15.771 pF | 70.517 pF | 22.600 pF |
| LRS | 0.054 MΩ | 0.094 MΩ | 2.011 MΩ | 6.114 MΩ | 5.963 pF | 48.079 pF | 76.0180 pF | 0.738 pF |

Referring to FIG. 18 and Table 2, it can be known that each of the resistance values of the interface region (with Ni), the $Si_3N_4$ layer, the GO layer, and the $FeO_x$ layer is changed according to the resistance state.

In addition, referring to FIG. 19 and Table 2, it can be known that each of the capacitance values of the interface

410: GRAPHENE OXIDE LAYER
410: METAL OXIDE LAYER
500: SECOND ELECTRODE

The invention claimed is:
1. A nonvolatile memory device comprising:
a substrate;

a first electrode disposed on the substrate;

a dielectric layer disposed on the first electrode, wherein the dielectric layer has resistance and capacitance changed by a tunneling conduction phenomenon of charges according to an applied voltage, has rectifying characteristics, and includes a dielectric material;

an active layer disposed on the dielectric layer, wherein the active layer has resistance and capacitance changed according to the applied voltage, and includes a graphene oxide complex; and a second electrode disposed on the active layer, wherein the nonvolatile memory device has multi-level resistance and capacitance values according to the applied voltage, wherein the graphene oxide complex includes a graphene oxide layer, and a metal oxide layer disposed on the graphene oxide layer, wherein the metal oxide layer is a layer composed of iron oxide nanoparticles, wherein the iron oxide nanoparticles have $\gamma$-Fe2O3 and Fe3O4 particles, and wherein metal oxide of the metal oxide layer is an oxide semiconductor material.

2. The nonvolatile memory device according to claim 1, wherein the dielectric layer includes $Si_3N_4$, $SiO_2$, $SiO_xN_y$, AlN or $Al_2O_3$.

3. The nonvolatile memory device according to claim 1, wherein the active layer is formed on the dielectric layer by performing a solution process.

4. A method for manufacturing a nonvolatile memory device, the method comprising:

forming a first electrode on a substrate;

forming, on the first electrode, a dielectric layer that has resistance and capacitance changed by a tunneling conduction phenomenon of charges according to an applied voltage, has rectifying characteristics, and includes a dielectric material;

forming, on the dielectric layer, an active layer that has resistance and capacitance changed according to the applied voltage and includes a graphene oxide complex; and forming a second electrode on the active layer, wherein the nonvolatile memory device has multi-level resistance and capacitance values according to the applied voltage, wherein the graphene oxide complex includes a graphene oxide layer, and a metal oxide layer disposed on the graphene oxide layer, wherein the metal oxide layer is a layer composed of iron oxide nanoparticles, wherein the iron oxide nanoparticles have $\gamma$-Fe2O3 and Fe3O4 particles, and wherein metal oxide of the metal oxide layer is an oxide semiconductor material.

5. The method for manufacturing the nonvolatile memory device according to claim 4, wherein the forming the active layer includes applying a solution including graphene oxide and the metal oxide onto the dielectric layer.

* * * * *